US012637884B2

(12) United States Patent　　(10) Patent No.: US 12,637,884 B2

Tsorng et al.　　(45) Date of Patent: May 26, 2026

(54) HANDLE ASSEMBLY, CONNECTING ROD MODULE, AND METHOD OF USING A CONNECTING ROD MODULE

(71) Applicant: Quanta Computer Inc., Taoyuan City (TW)

(72) Inventors: Yaw-Tzorng Tsorng, Taoyuan City (TW); Tung-Hsien Wu, Taoyuan City (TW); Hsiang-Pu Ni, Taoyuan City (TW); Yao-Lin Zhang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 16 days.

(21) Appl. No.: 18/953,723

(22) Filed: Nov. 20, 2024

(65) Prior Publication Data

US 2026/0139530 A1　　May 21, 2026

(51) Int. Cl.
*E05C 1/14*　　(2006.01)
*H05K 5/02*　　(2006.01)
*H05K 7/14*　　(2006.01)

(52) U.S. Cl.
CPC .............. *E05C 1/14* (2013.01); *H05K 5/023* (2013.01); *H05K 7/1488* (2013.01)

(58) Field of Classification Search
CPC ......... E05C 1/14; H05K 5/023; H05K 7/1488
USPC .......................................... 248/682; 361/825
See application file for complete search history.

(56) References Cited

U.S. PATENT DOCUMENTS

| | | | | |
|---|---|---|---|---|
| 2,944,864 | A * | 7/1960 | Krivulka | E05B 65/46 439/372 |
| 7,027,309 | B2 * | 4/2006 | Franz | H01R 13/62933 361/740 |
| 8,256,737 | B2 * | 9/2012 | Stango | G05G 5/005 248/642 |
| 10,485,123 | B1 | 11/2019 | Lin et al. | |
| 2012/0218705 | A1 * | 8/2012 | Huang | G06F 1/187 361/679.37 |
| 2013/0252451 | A1 * | 9/2013 | Henry | G02B 6/4246 439/350 |

FOREIGN PATENT DOCUMENTS

| | | |
|---|---|---|
| TW | I854923 B | 9/2024 |

OTHER PUBLICATIONS

TW Search Report for Application No. 114107981 mailed Sep. 16, 2025, w/ First Office Action, 10 p.
TW Office Action for Application No. 114107981 mailed Sep. 16, 2025, w/ Summary, 5 pp.

* cited by examiner

*Primary Examiner* — Kristina R Fulton
*Assistant Examiner* — Thomas L Neubauer
(74) *Attorney, Agent, or Firm* — NIXON PEABODY LLP

(57)　　　ABSTRACT

A handle assembly, a connecting rod including a handle assembly, and a method for allowing withdrawal of an object from an enclosure including a handle assembly are disclosed. The handle assembly includes a handle mechanism. The handle mechanism includes a handle plate and handle arms extending from opposite sides of the handle plate. Each of the handle arms includes a handle arm aperture and a handle arm slot. The handle mechanism further includes a latch extending at least partially across the handle plate, and a pair of sliders engaged with the latch at opposite ends thereof.

20 Claims, 16 Drawing Sheets

100

104

102

108

106

101

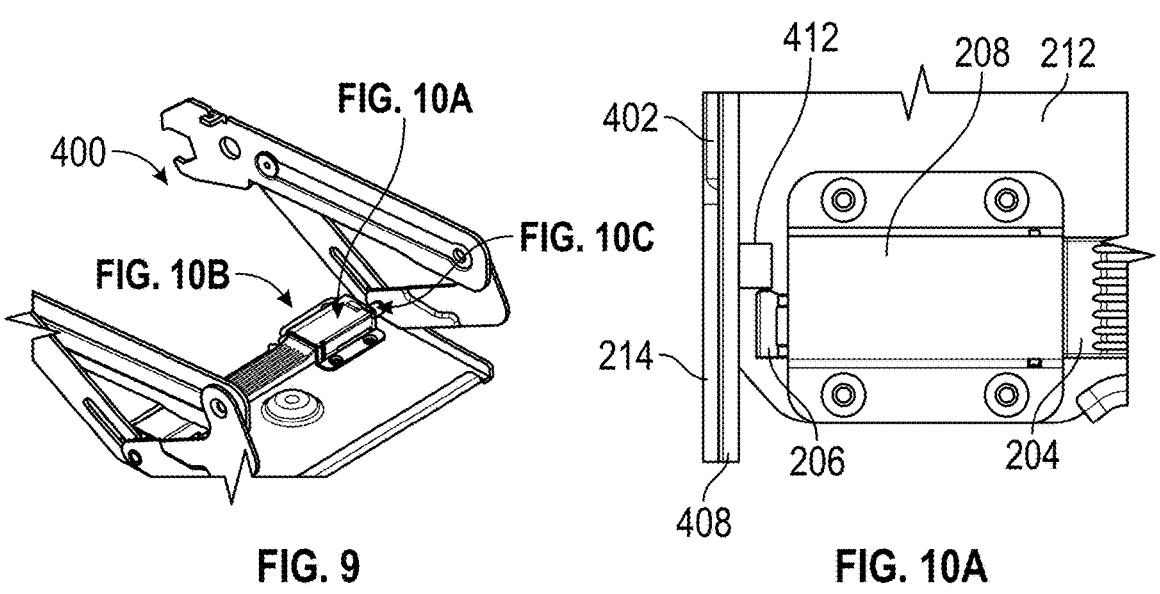
FIG. 9
FIG. 10A
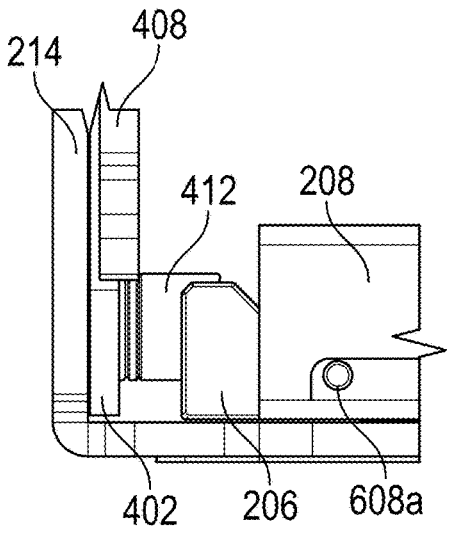
FIG. 10B
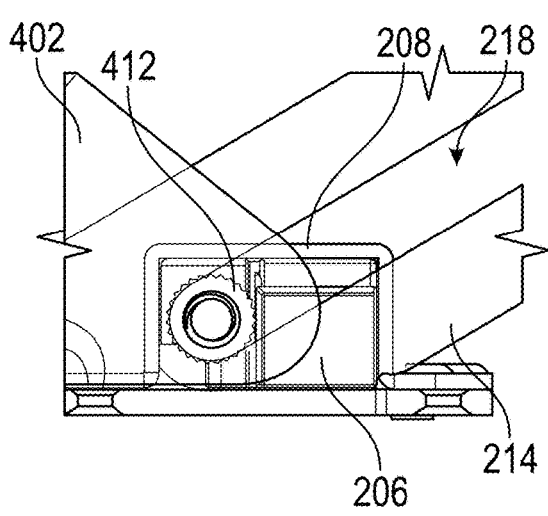
FIG. 10C

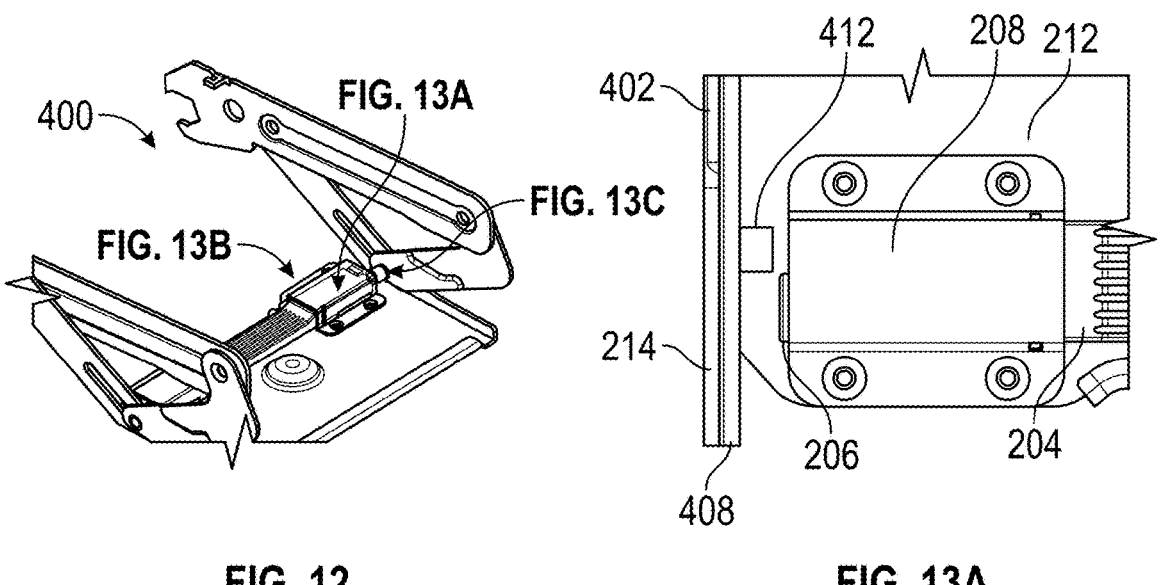
FIG. 12
FIG. 13A
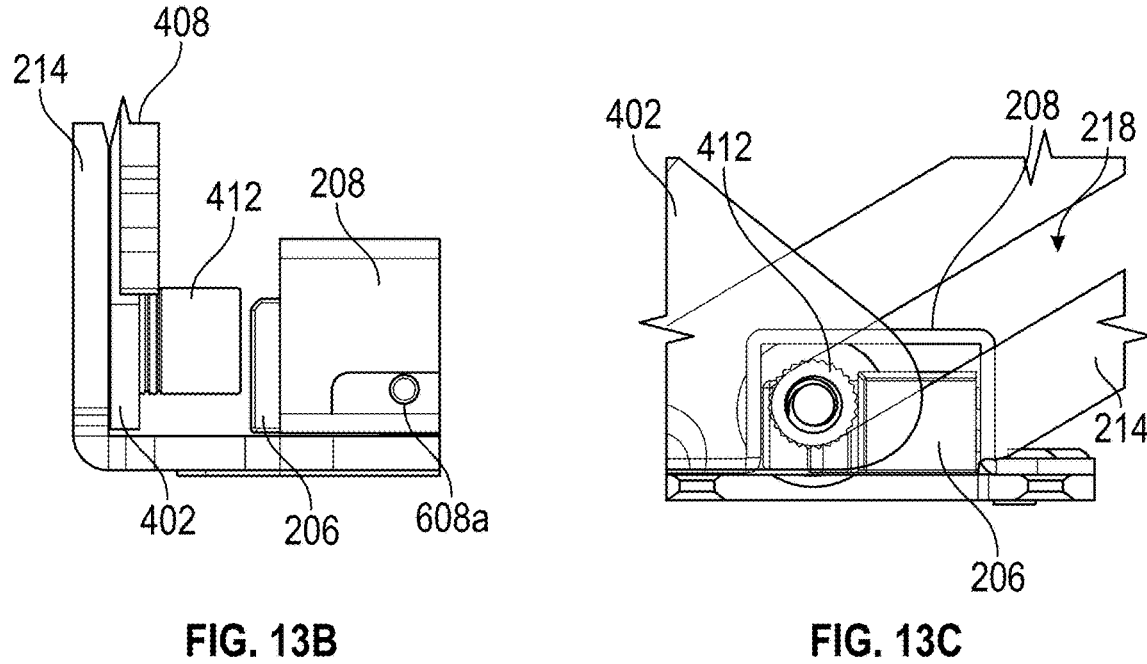
FIG. 13B
FIG. 13C

HANDLE ASSEMBLY, CONNECTING ROD MODULE, AND METHOD OF USING A CONNECTING ROD MODULE

FIELD OF THE INVENTION

The present invention relates generally to modules, and more specifically, to handles for accessing and removing modules.

BACKGROUND OF THE INVENTION

Space planning within a server rack has become very important to handle large amounts of data. In addition to holding the servers, the server rack also contains a variety of other equipment, including enclosures and objects held within the enclosures. Taking liquid cooling equipment as an example, FIG. 1 shows a server rack 100 having a chassis 101 with an enclosure 102. Above the enclosure 102 is a drain pan 104. Within the enclosure 102 is a pump module 108 for the liquid cooling equipment. A conventional handle module 106 is connected to the pump module 108. The conventional handle module 106 is used to insert and remove the pump module 108 from the enclosure. Because the drain pan 104 is located directly above the enclosure 102, and perhaps may even partially define the enclosure 102, hand operating space is greatly restricted. The restricted hand operating space presents a risk of pinching the hand between the conventional handle module 106 and the drain pan 104 when pushing in the pump module 108. Similar restricted spaces are present in the server rack 100 not specifically tied to the enclosure 102 shown in FIG. 1.

The present application discloses a handle assembly, a connecting rod module, and a method of using a connecting rod module that solves the problems associated with the restricted space of such enclosures and similar restricted spaces within server racks.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one implementation of the present disclosure, a handle assembly is disclosed. The handle assembly includes a handle mechanism having a handle plate and handle arms extending from opposite sides of the handle plate. Each of the handle arms includes a handle arm aperture at a distal end thereof. The handle assembly further includes one or more springs coupled at first ends thereof to the handle plate. The handle assembly further includes a latch extending at least partially across the handle plate. The latch abuts against second ends of the one or more springs such that the one or more springs urge the latch away from the handle plate. Each end of the latch including a latch projection and two latch surfaces. The handle assembly further includes a pair of sliders engaged with the latch at opposite ends thereof. Each slider of the pair of sliders includes two slider projections and a slider surface. The handle assembly further includes a pair of brackets attached to the handle plate for securing the pair of sliders to the opposite ends of the latch. Each bracket of the pair of brackets includes a first bracket slot through which one latch projection extends and a second bracket slot through which the two slider projections of a respective slider extend. The first bracket slot is oriented generally perpendicular to the second bracket slot. The first bracket slot and the second bracket slot are angularly oriented to the latch surfaces and the slider surface.

According to an aspect of the implementation, for each slider of the pair of sliders, one slider projection of the two slider projections contacts a first latch surface of the two latch surfaces, and the slider surface contacts a second latch surface of the two latch surfaces.

According to another aspect of the implementation, each end of the latch includes a pair of the latch projection on opposite sides of the latch, and each bracket of the pair of brackets includes a pair of the first bracket slot on opposite sides of the bracket.

According to another aspect of the implementation, the two latch surfaces of each end of the latch are oriented in alignment with the slider surfaces of each of the respective sliders.

According to another aspect of the above aspect, the first bracket slot and the second bracket slot are angled 45 degrees relative to the latch surfaces and the slider surfaces.

According to another aspect of the implementation, the latch plate includes a latch plate aperture that accepts a fastener.

According to another aspect of the implementation, each of the handle arms includes a handle arm slot.

According to another aspect of the implementation, the handle assembly further includes a nut slidably positioned within each one of the handle arm slots.

According to another aspect of the above aspect, the pair of sliders restrict the nuts from sliding within the handle arm slots in a first state of the pair of sliders, the latch, and the nuts; and the pair of sliders do not restrict the nuts from sliding within the handle arm slots in a second state of the pair of sliders and the latch.

According to another aspect of the above aspect, the first state includes: the latch extended away from the handle plate by the one or more springs; the pair of sliders extended outward based, at least in part, on a first of the two latch surfaces and the slider surface; and the pair of sliders abutting the nuts with the nuts at first ends of the handle arm slots.

According to another aspect of the above aspect, the second state includes: the latch depressed toward the handle plate; the pair of sliders extended inward based, at least in part, on a second of the two latch surfaces and respective projections of the sliders; and the pair of sliders abutting the nuts with the nuts at first ends of the handle arm slots.

According to another implementation of the present disclosure, a connecting rod module for withdrawing and inserting an object within an enclosure is disclosed. The connecting rod module includes a handle assembly. The handle assembly includes a handle mechanism including a handle plate and handle arms extending from opposite sides of the handle plate. Each of the handle arms includes a handle arm aperture and a handle arm slot. The handle assembly further includes a latch extending at least partially across the handle plate. The handle assembly further includes a pair of sliders engaged with the latch at opposite ends thereof. The connecting rod module further includes a pair of connecting rods. Each connecting rod is secured at a first connecting rod end to a respective one of the handle arms by a nut extending through the connecting rod and into the handle arm slot of the respective one of the handle arms. The connecting rod module further includes a pair of levers. Each lever is secured at a first lever end to a respective one of the connecting rods at a second connecting rod end and secured at a respective one of the handle arms at the respective handle arm aperture. The latch in a first state causes the pair of sliders to block the nuts of the connecting rods within the respective handle arm slots. The latch in a second state causes the pair of sliders to not block the nuts of the connecting rods within the respective handle arm slots.

According to an aspect of the implementation, each lever is rotatably connected to the respective one of the connecting rods at the first lever end.

According to another aspect of the implementation, each lever is rotatably connected to a respective one of the handle arms at the handle arm aperture of the respective handle arms.

According to another aspect of the implementation, each connecting rod is rotatably secured at the first connecting rod end to the respective one of the handle arms by the nut.

According to another aspect of the implementation, the latch includes latch surfaces at opposite ends thereof. Each slider includes a slider surface that interfaces with one of the latch surfaces to cause the slider to retract into the latch when the latch is depressed toward the handle plate such that the slider does not restrict movement of the nut.

According to another aspect of the implementation, each lever includes a hook at a second lever end that is opposite the first lever end. The hook is configured to contact a first stop point of the enclosure.

According to another aspect of the above aspect, each lever includes a lever contact surface at the second lever end, and the lever contact surface is configured to contact a second stop point of the object.

According to another implementation of the present disclosure, a method for allowing withdrawal of an object from an enclosure is disclosed. The method includes providing for a lever rotatably connected to the object to rotate away from the object at a first hinge until a hook on the lever contacts a first stop point on the enclosure. The method further includes providing for a handle arm connected to the lever to rotate away from the object at a second hinge. The method further includes providing for a connecting rod connected to the handle arm to rotate away from the object at a third hinge. Rotation of the handle arm and the connecting rod causes a nut connecting the handle arm to the connecting rod to move from a first end of a handle arm slot within the handle arm toward a second end of the handle arm slot. The method further includes providing for a latch secured on a handle plate connected to the handle arm to transition between a first state, that retracts a slider relative to the latch, and a second state, that extends the slider relative to the latch, so that the slider allows the nut to access the second end of the handle arm slot and restricts the nut from leaving the second end of the handle arm slot. The method further includes providing for the lever rotatably connected to the object to rotate further away from the object at the first hinge until a lever contact surface of the lever contacts a second stop point on the object.

According to an aspect of the implementation, the method further includes providing for a fastener that extends through an aperture of the handle plate to release from the object to permit the handle plate to be rotated away from the object.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

FIG. 9 shows a partial perspective view of the connecting rod module from FIG. 4, according to aspects of the present disclosure.

FIG. 10A shows a partial top view of the connecting rod module in FIG. 9, according to aspects of the present disclosure.

FIG. 10B shows a partial side view of the connecting rod module in FIG. 9, according to aspects of the present disclosure.

FIG. 10C shows a partial side view of the connecting rod module in FIG. 9, according to aspects of the present disclosure.

FIG. 12 shows a partial perspective view of the connecting rod module from FIG. 11, according to aspects of the present disclosure.

FIG. 13A shows a partial top view of the connecting rod module in FIG. 12, according to aspects of the present disclosure.

FIG. 13B shows a partial side view of the connecting rod module in FIG. 12, according to aspects of the present disclosure.

FIG. 13C shows a partial side view of the connecting rod module in FIG. 12, according to aspects of the present disclosure.

DETAILED DESCRIPTION

Figure 1:
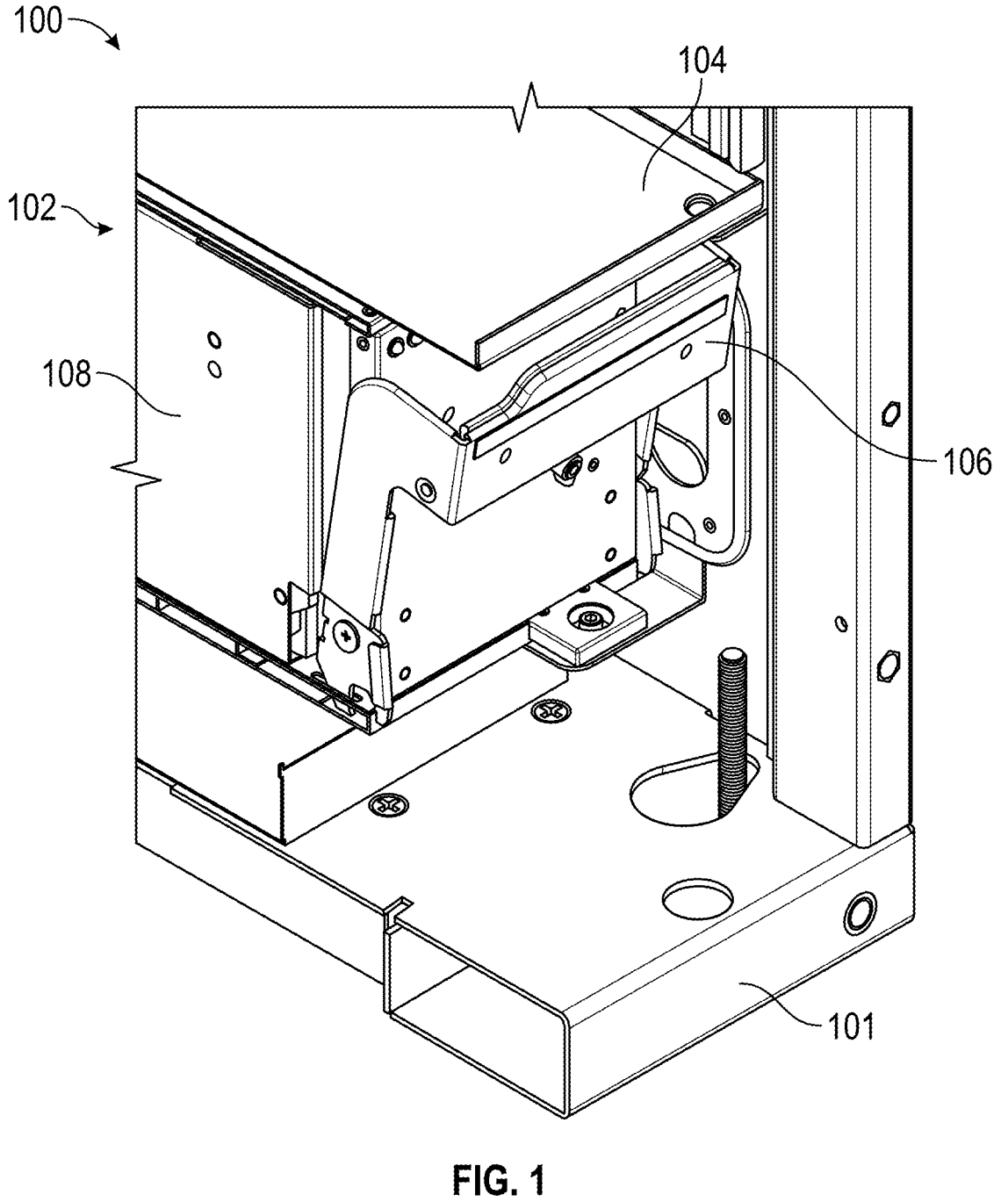
FIG. 1 shows a partial perspective view of a computing chassis.

The present application discloses a handle assembly and a connecting rod module that can increase an opening angle to achieve at least two functions. First, the handle assembly and the connecting rod module can increase a gap between the handle mechanism and an object above the handle mechanism, such as the above-described drain pan. The handle assembly and the connecting rod module can ensure that users can push and pull an object in a crowded space, such as a crowded server rack. Second, the handle assembly and the connecting rod module can fix the opening angle when pulling out the object and intuitively change the user's hand operating position when pushing in the object to avoid pinching the hand.

Various embodiments are described with reference to the attached figures, where like reference numerals are used throughout the figures to designate similar or equivalent elements. Each reference numeral identifies the figure in which the reference numeral first appears based on the first digit (for three-digit reference numerals) or the first two digits (for four-digit reference numerals) corresponding to the figure numeral of the figure. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
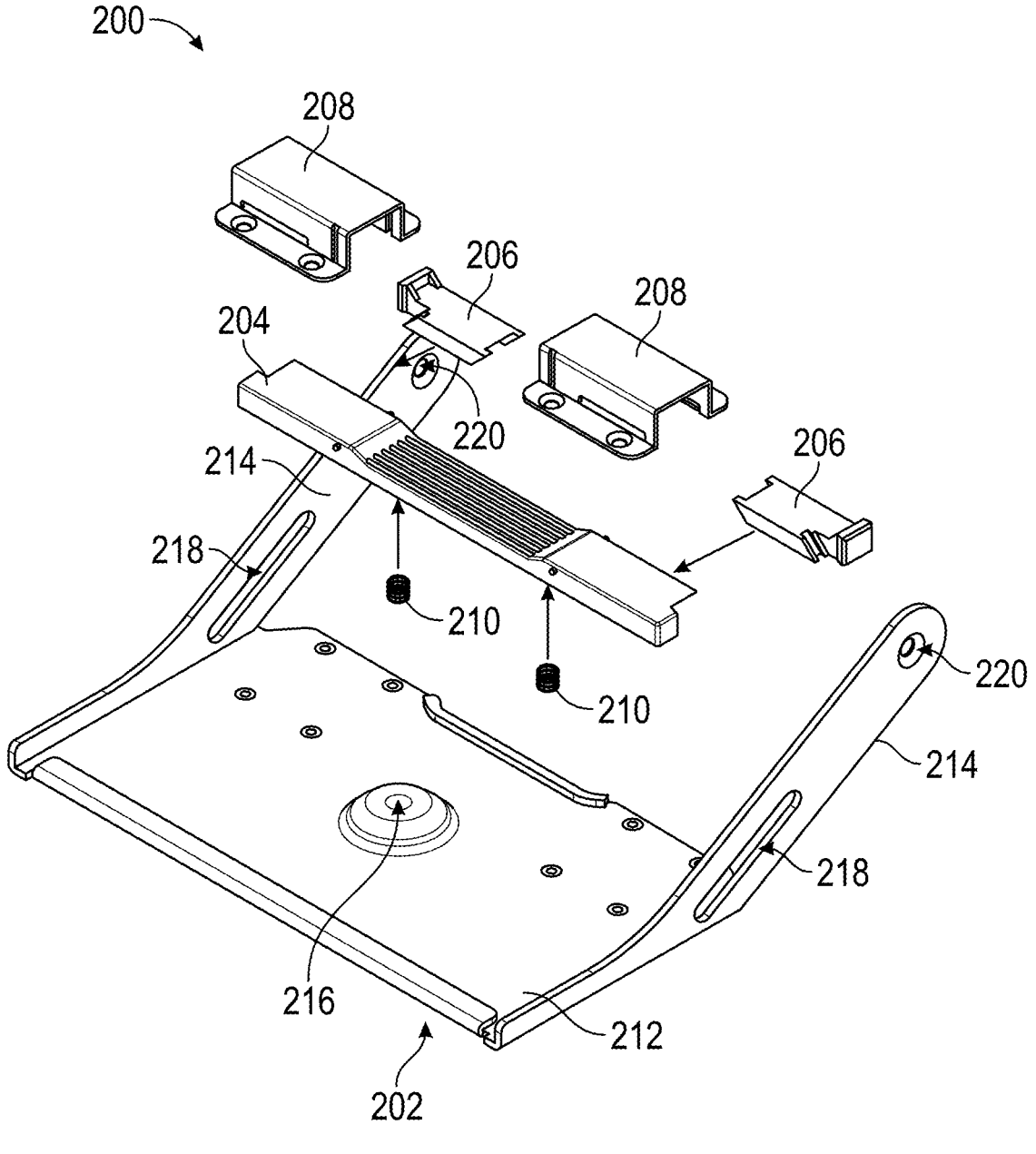
FIG. 2 shows an exploded view of a handle assembly, according to aspects of the present disclosure.
Figure 3:
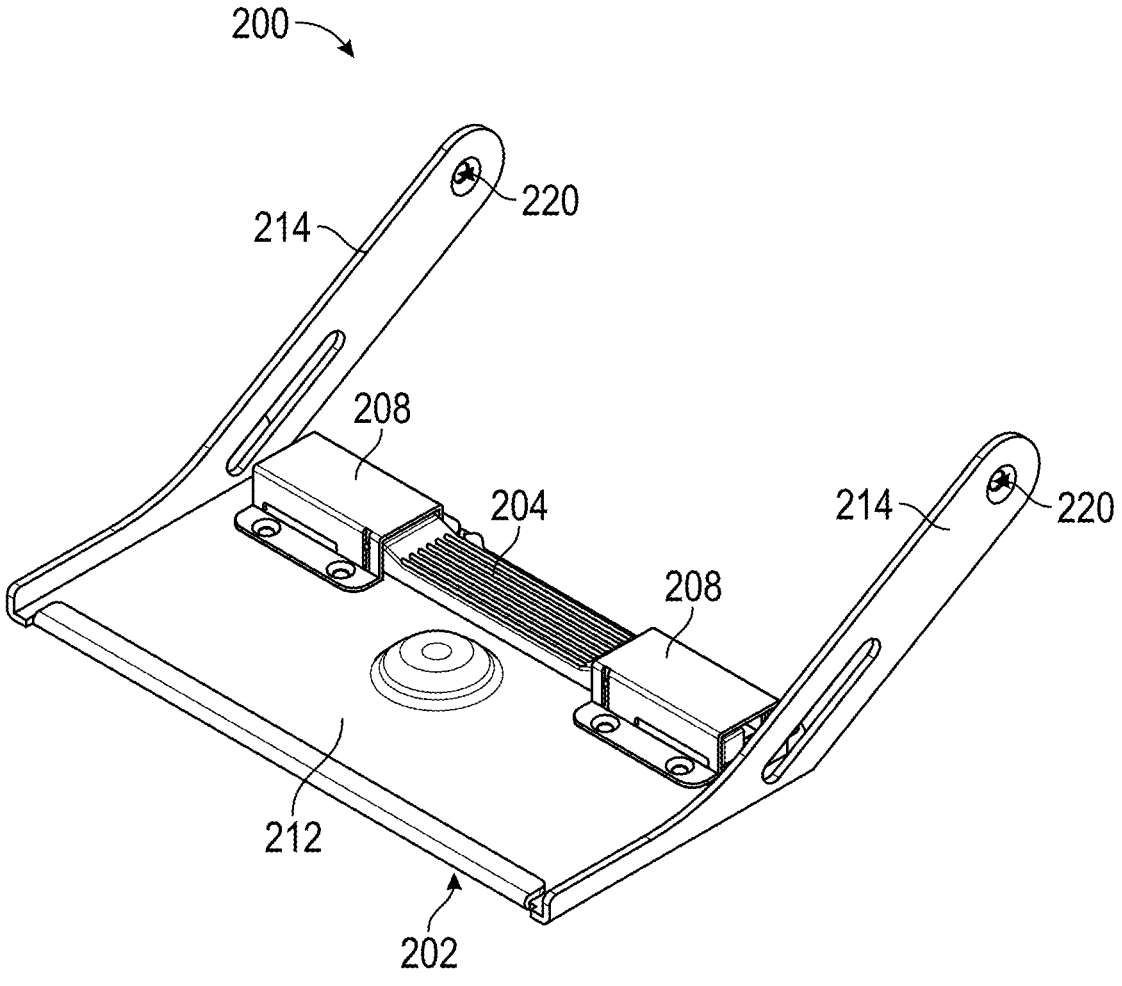
FIG. 3 shows an assembled perspective view of the handle assembly of FIG. 2, according to aspects of the present disclosure.

Referring to FIGS. 2 and 3, FIG. 2 shows an exploded view of a handle assembly 200, and FIG. 3 shows an assembled perspective view of the handle assembly 200, according to aspects of the present disclosure. The handle assembly 200 includes a handle mechanism 202. A user can manipulate the handle mechanism 202 when actuating the handle assembly 200, as further described below.

The handle assembly 200 further includes a latch 204. The latch 204 extends at least partially across the handle mechanism 202. A user manipulates the latch 204 for locking and unlock the handle assembly 200, as further described below.

The handle assembly 200 further includes a slider 206. In the implementation shown in FIG. 2, the handle assembly 200 includes a pair of sliders 206, referred to together as sliders 206. However, in some implementations, there can be only one slider 206. The sliders 206 are engaged with the latch 204 at opposite ends thereof. The sliders 206 are moved by the latch 204 to lock and unlock the handle assembly 200, as further described below. The sliders 206 are generally objects that include various elements that allow for the functions further described below.

The handle assembly 200 further includes a bracket 208. In the implementation shown in FIG. 2, the handle assembly 200 includes a pair of brackets 208, referred to together as brackets 208. However, in some implementations, there can be only one bracket 208. Each one of the brackets 208 secures the latch 204 to the handle mechanism 202 and secures the sliders 206 to the latch 204. The brackets 208 also cover the sliders 206. As described further below, the brackets 208 include slots that control the position of the latch 204 and the sliders 206.

The handle assembly 200 further includes a spring 210. The springs 210 are coupled at first ends thereof to the handle mechanism 202 and abut the latch 204 and opposite ends. In the implementation shown in FIG. 2, the handle assembly 200 includes a pair of springs 210, referred to together as springs 210. The springs 210 are configured to urge the latch 204 away from the handle mechanism 202. In some configurations, the springs 210 maintain the handle assembly 200 in a locked position, as described further below.

Referring back to the handle mechanism 202, the handle mechanism 202 includes a handle plate 212 and handle arms 214. The handle plate 212 is the piece of the handle mechanism 202 that a user typically grasps when manipulating the handle mechanism 202. The handle plate 212 can be generally rectangular and flat. However, the handle plate 212 can take other shapes. The handle arms 214 extend from opposite sides of the handle plate 212. The handle arms 214 attach the handle plate 212, and thereby the handle mechanism 202 and handle assembly 200, to other elements of a connecting rod module, as will be further described below.

The handle arms 214 include slots 218 and apertures 220. As described further below, the slots 218 and apertures 220 accept elements of the connecting rod module for operating the handle assembly 200 within the connecting rod module.

In some implementations, the handle plate 212 includes an aperture 216. As described below, the aperture 216 accepts a fastener that can secure the handle assembly 200 from moving. However, in some implementations, the handle plate 212 may lack the aperture 216.

Figure 4:
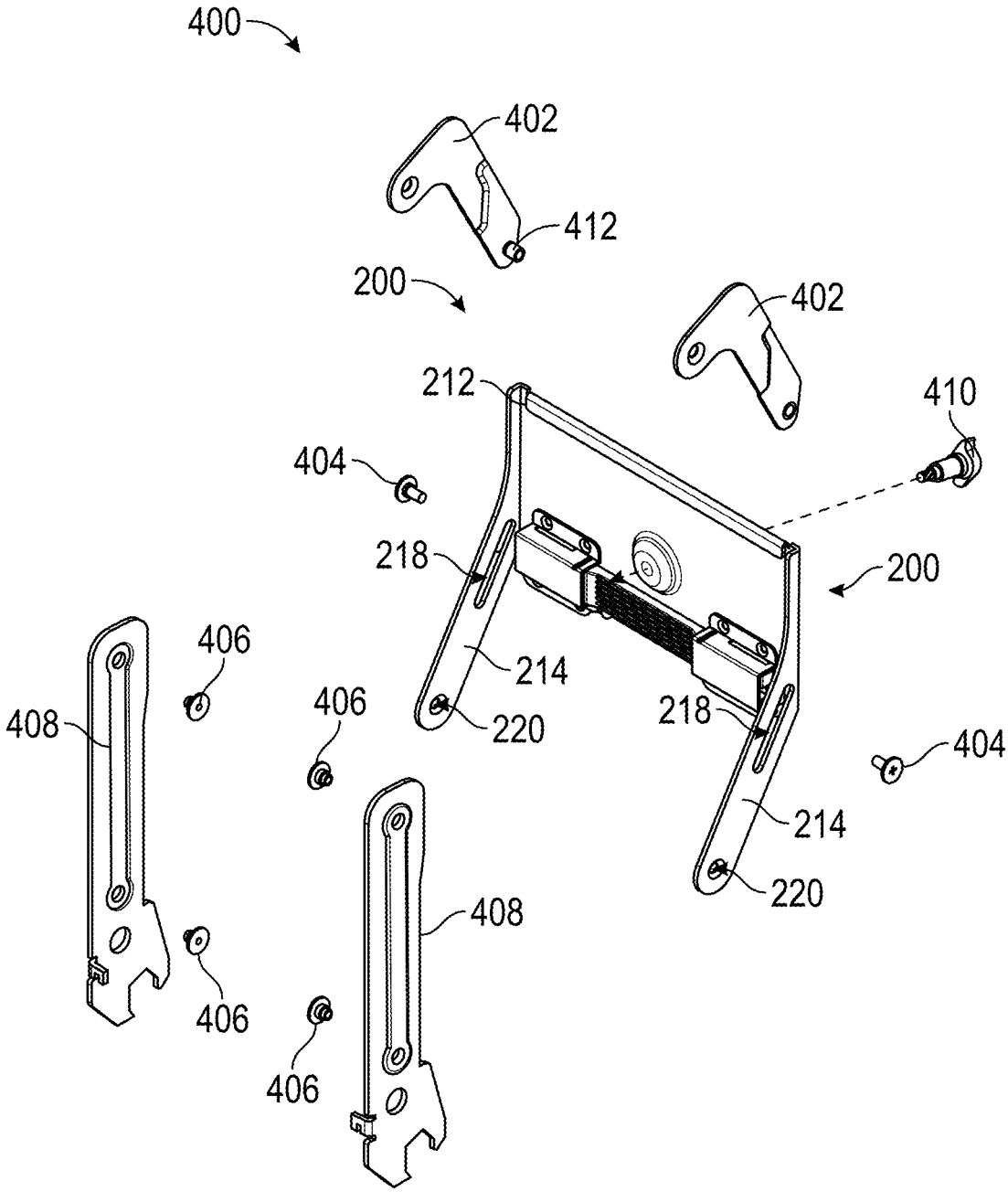
FIG. 4 shows an exploded view of a connecting rod module, according to aspects of the present disclosure.
Figure 5:
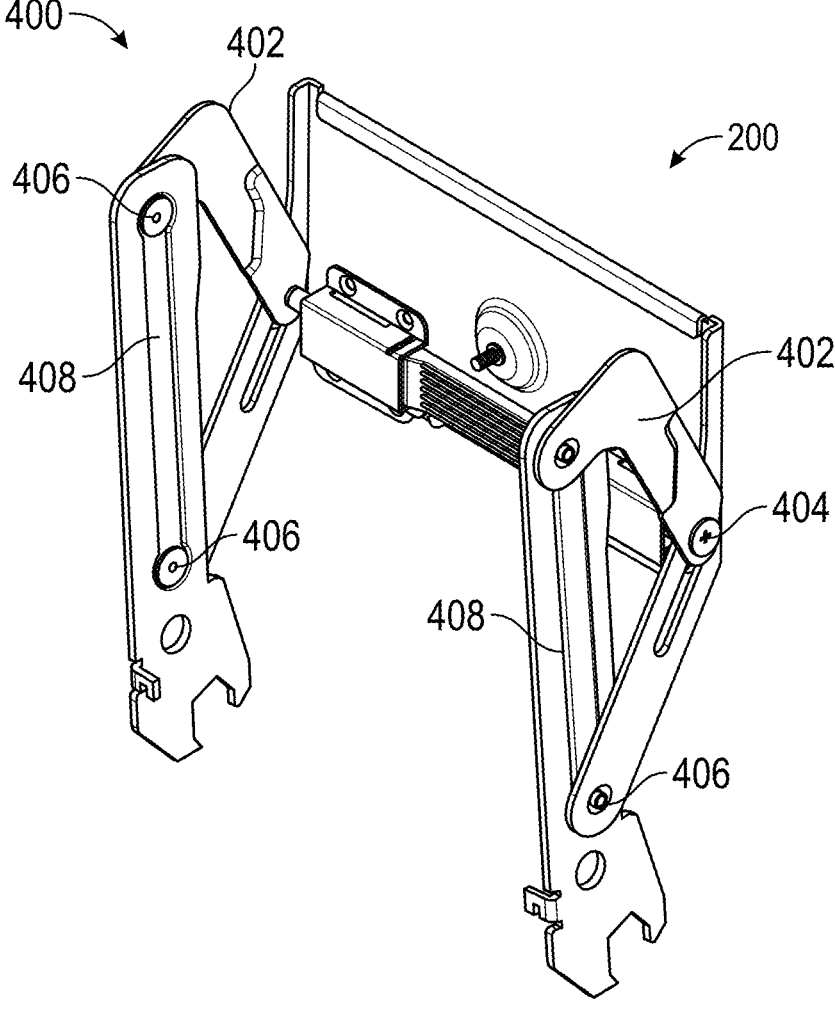
FIG. 5 shows an assembled perspective view of the connecting rod module of FIG. 4, according to aspects of the present disclosure.

Referring to FIGS. 4 and 5, FIG. 4 shows an exploded view of a connecting rod module 400, and FIG. 5 shows an assembled perspective view of the connecting rod module 400, according to aspects of the present disclosure. The connecting rod module 400 includes the handle assembly 200 of FIGS. 2 and 3. In addition, the connecting rod module 400 includes other elements, as follows.

The connecting rod module 400 includes connecting rods 402. As shown in FIG. 4, the connecting rods 402 can generally be in the shape of an L. However, the connecting rods 402 can have various other shapes. Proximal ends of the connecting rods 402 include projections 412 that fit into the slots 218 of the handle arms 214 of the handle assembly 200. The connecting rods 402 can rotate and translate relative to the slots 218.

In some implementations, fasteners 404 interface with the proximal ends of the connecting rods 402, where the connecting rods 402 fit into the slots 218 of the handle arms 214. The fasteners 404 secure the connecting rods 402 in the slots 218. In some implementations, the fasteners 404 can be screws or pins.

Opposite ends of the connecting rods 402 attach to levers 408 of the connecting rod module 400. The connecting rods 402 can rotate relative to the levers 408.

Along with the connecting rods 402, ends of the handle arms 214 opposite from the handle plate 212 connect to the levers 408. The handle arms 214 can rotate relative to the levers 408. In some implementations, fasteners 406 secure the levers 408 to the connecting rods 402 and the handle arms 214. In some implementations, the fasteners 406 can be screws or pins.

Figures 17, 18:
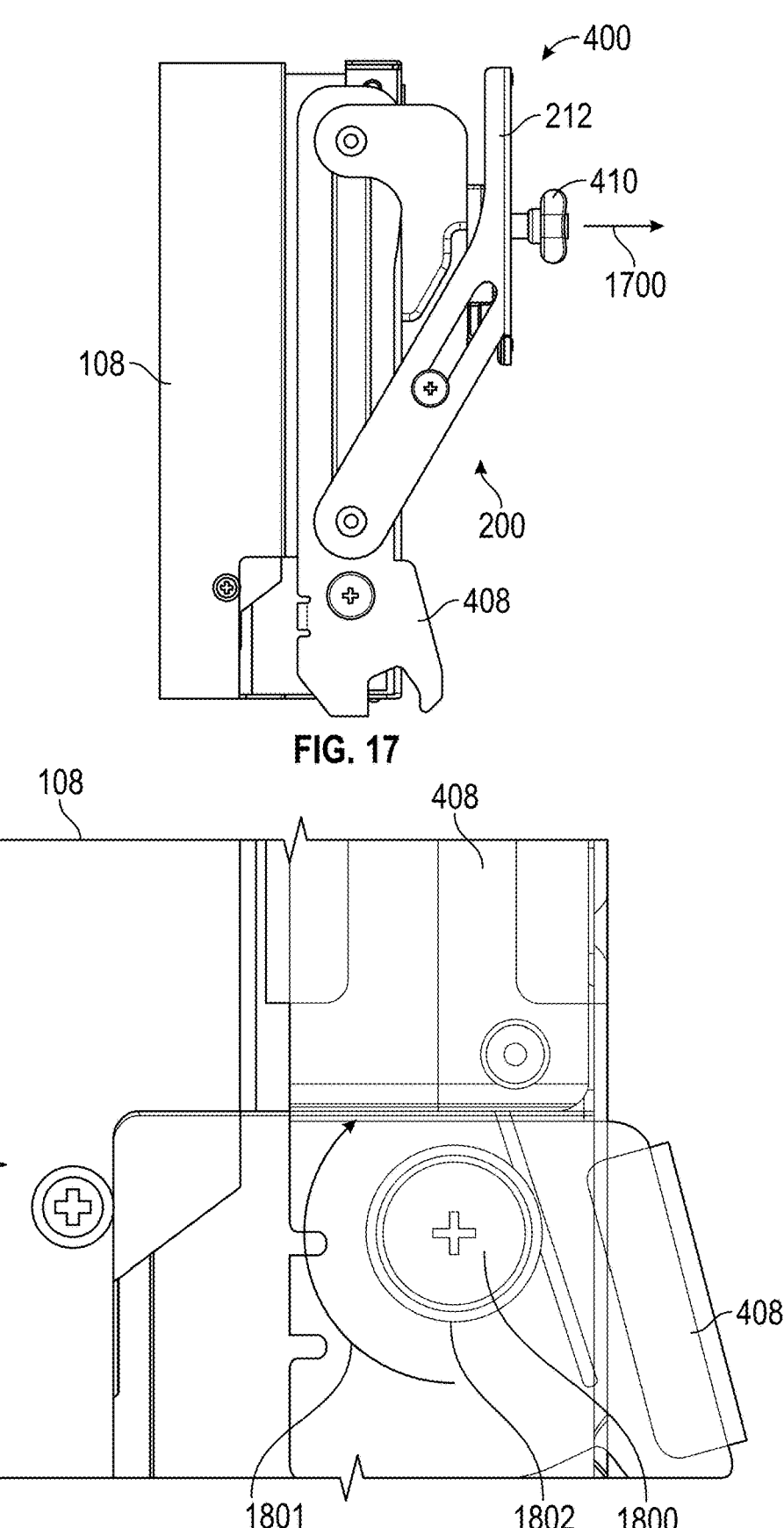
FIG. 17 shows a side view of the connecting rod module in the closed state of FIG. 14, according to aspects of the present disclosure.
FIG. 18 shows a partial detailed side view of the connecting rod module in the closed state of FIG. 14, according to aspects of the present disclosure.

Referring specifically to FIG. 4, in some implementations, the connecting rod module 400 further includes a fastener 410, as described above with respect to the aperture 216. Specifically, the fastener 410 can engage the handle plate 212 within the aperture 216. The fastener 410 can secure the handle assembly 200 from moving, as further described below (FIG. 17). In some implementations, the fastener 410 can be a thumb screw.

Figure 6:
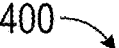
FIG. 6 shows a side view of a latch of the connecting rod module of FIG. 4 in a first state, according to aspects of the present disclosure.
Figure 6:
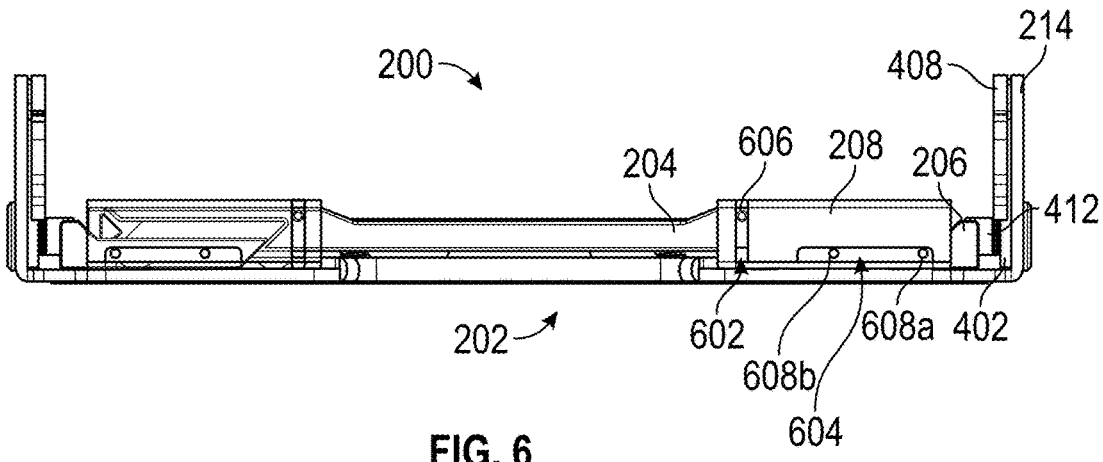
Figure 7:
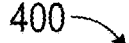
FIG. 7 shows a partially transparent side view of the latch of the connecting rod module of FIG. 4 in the first state, according to aspects of the present disclosure.
Figure 7:
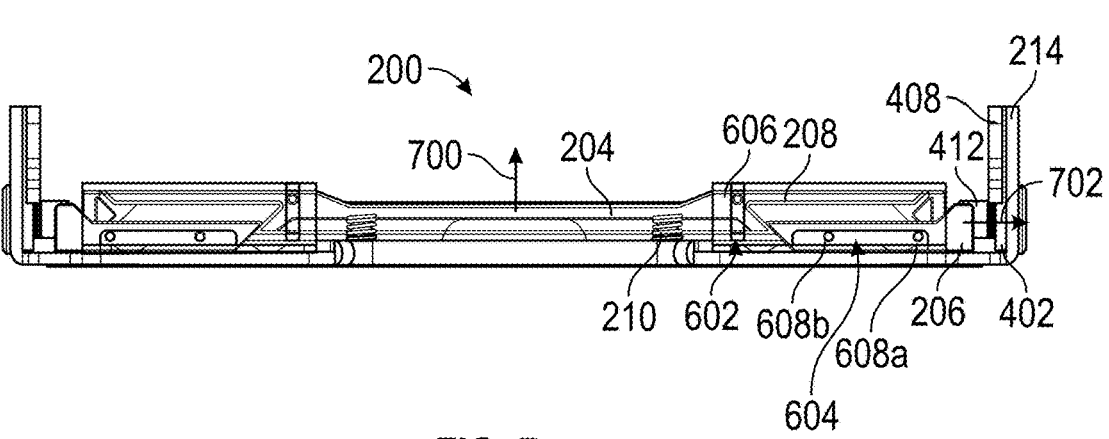

Referring to FIG. 6, shown is a side view of the connecting rod module 400 of FIGS. 4 and 5, according to aspects of the present disclosure. Further, FIG. 7 shows a partially transparent side view of the connecting rod module 400 shown in FIG. 6, according to aspects of the present disclosure. Although only the right sides in FIGS. 6 and 7 are labeled and described below, the left sides of the connecting rod module 400 in FIGS. 6 and 7 can be a mirror copy of the right sides of the connecting rod module 400 in FIGS. 6 and 7.

The bracket 208 is shown in FIGS. 6 and 7 covering the slider 206. The bracket 208 includes slots 602 and 604. The slot 602 is a vertical slot in the orientation shown in FIGS. 6 and 7. The slot 604 is a horizontal slot in the orientation shown in FIGS. 6 and 7. Thus, the slot 604 is in a different orientation than the orientation of the slot 602. More specifically, the slot 604 is perpendicular to the slot 602.

A projection 606 of the latch 204 fits within the slot 602. Projections 608a and 608b of the slider 206 fit within the slot 604. According to some implementations, the latch 204 can include an identical projection as the projection 606 on the opposite side of the latch 204 than what is shown in FIG. 7. In which case, the bracket 208 includes an identical slot as slot 602 on the opposite side of the bracket 208 than what is shown in FIG. 7.

Similarly, according to some implementations, the slider 206 can include identical projections as the projections 608a and 608b on the opposite side of the slider 206 than what is shown in FIG. 7. In which case, the bracket 208 includes an identical slot as slot 604 on the opposite side of the bracket 208 than what is shown in FIG. 7.

Figure 8:
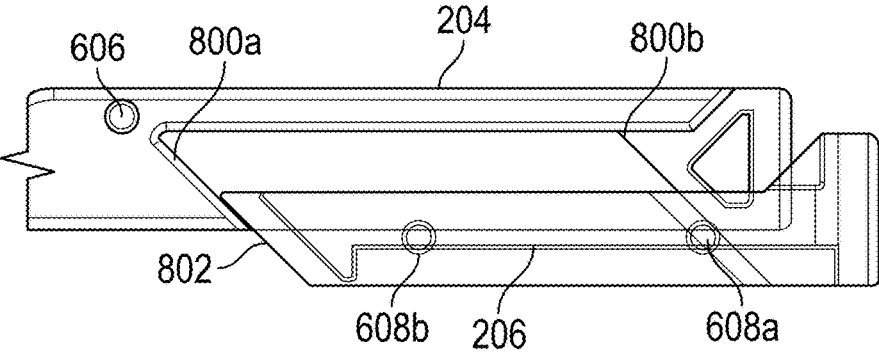
FIG. 8 shows a side view of the latch and a slider of the connecting rod module of FIG. 4, according to aspects of the present disclosure.

Because the latch 204 and the sliders 206 are in oblique contact, each bracket 208 limits the movement paths of the latch 204 and the respective slider 206. More specifically, and referring to FIG. 8, shown is a partial side view of the latch 204 and the slider 206, according to aspects of the present disclosure. The latch 204 includes surfaces 800a and 800b. The slider 206 includes a surface 802. The surfaces 800a and 802 interact to cause the slider 206 to translate right in the orientation of FIG. 8 in response to the latch 204 moving from down to up. The surface 800b and the projection 608a interface to cause the slider 206 to translate left in the orientation of FIG. 8 in response to the latch moving from up to down.

When the connecting rod module 400 is opened to a maximum extent, the sliders 206 limit the position of the projection 412 on the connecting rod 402, thereby achieving the function of fixing an opening angle of the handle assembly 200. Specifically, when the latch 204 is in a locked state, such as shown in FIGS. 6 and 7, the force of the springs 210 underneath urges the latch 204 in the direction of arrow 700 and pushes the slider 206 outward in the direction of arrow 702. At this point, the slider 206 is in the path of the projection 412 on the connecting rod 402. The projection 412 cannot slide in the slot 218 of the handle arm 214 of the handle assembly 200.

FIGS. 9 and 10A-10C show the relative positions of elements of the connecting rod module 400 from different viewpoints, according to aspects of the present disclosure. As can be seen in FIGS. 10A-10C, the slider 206 blocks the projection 412 from moving relative to the handle arm 214 along the slot 218.

Figure 11:
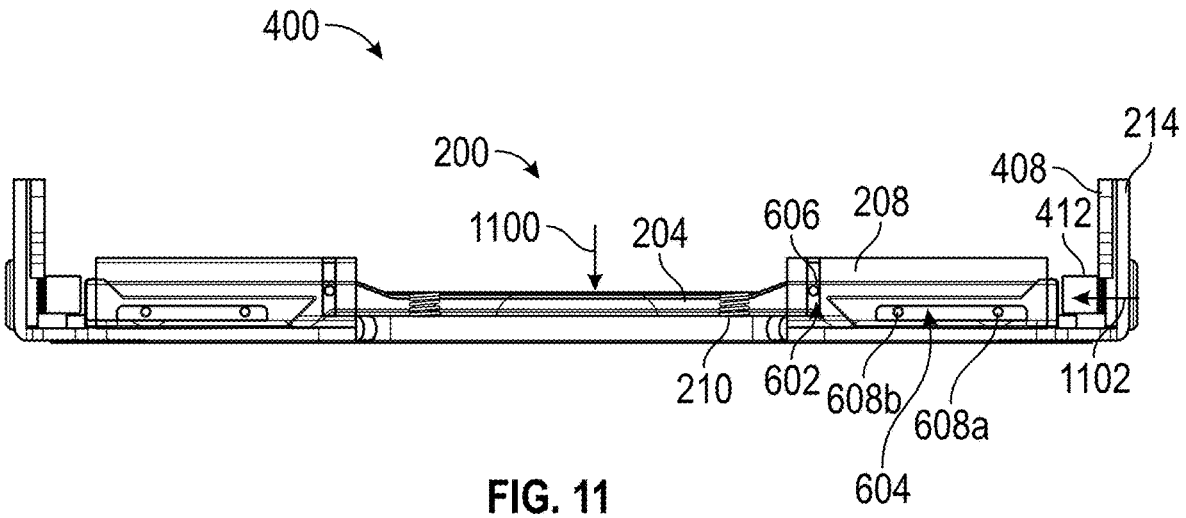
FIG. 11 shows a partially transparent side view of the connecting rod module of FIG. 4 in a second state, according to aspects of the present disclosure.

Referring to FIG. 11, shown is a partially transparent side view of the connecting rod module 400 of FIGS. 4 and 5, according to aspects of the present disclosure. When the latch 204 is depressed in the direction of arrow 1100, the springs 210 compress downward, and the latch 204 retracts the slider 206 back inward in the direction of arrow 1102. The position of the slider 206 no longer blocks the path of the projection 412, thereby allowing the projection 412 to move freely in the slot 218 of the handle arm 214 of the handle assembly 200.

FIGS. 12 and 13A-13C show the relative positions of elements of the connecting rod module 400 from different viewpoints with the latch 204 in the depressed state, according to aspects of the present disclosure. As can be seen in FIGS. 13A-13C, the slider 206 no longer blocks the projection 412 from moving relative to the handle arm 214 along the slot 218. Thus, operation of the latch 204 can cause the connecting rods 402 to be locked or free to move relative to the handle arms 214.

Figure 14:
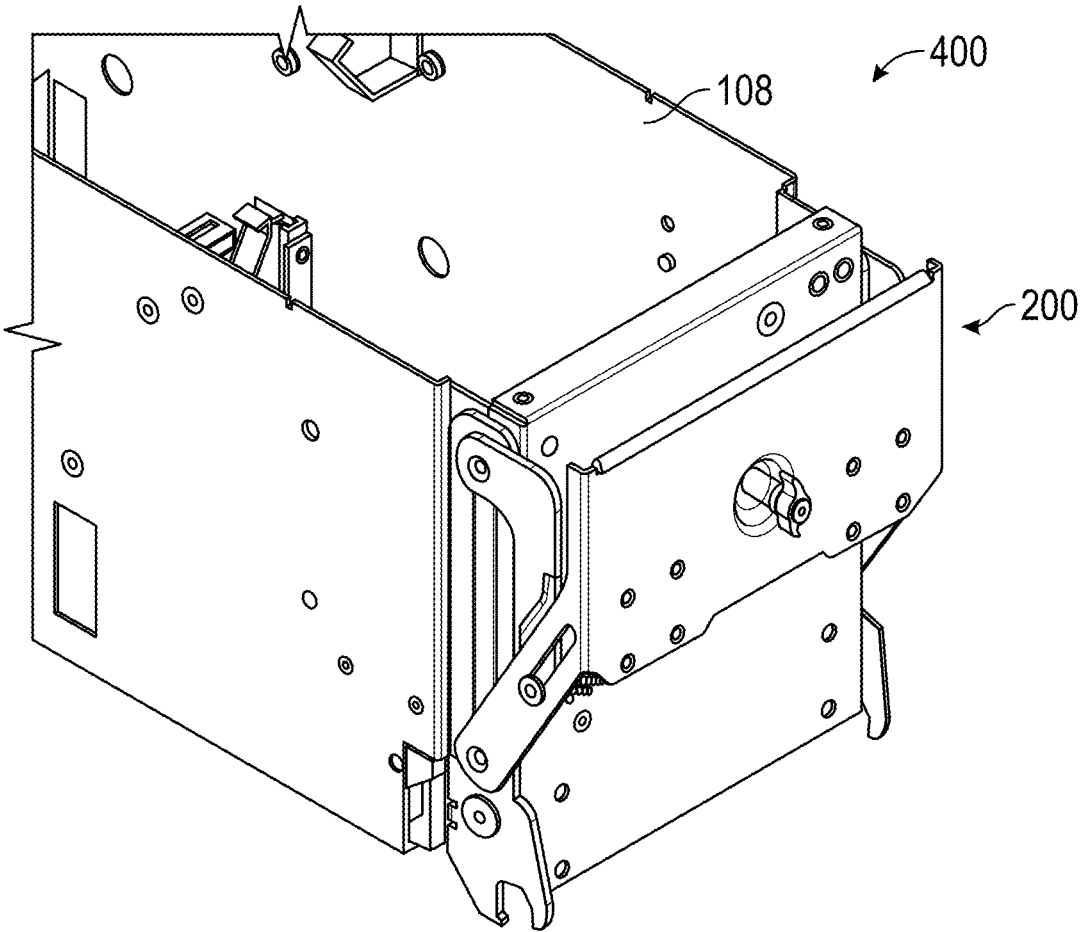
FIG. 14 shows a perspective view of a connecting rod module in a closed state while connected to an object, according to aspects of the present disclosure.
Figure 15:
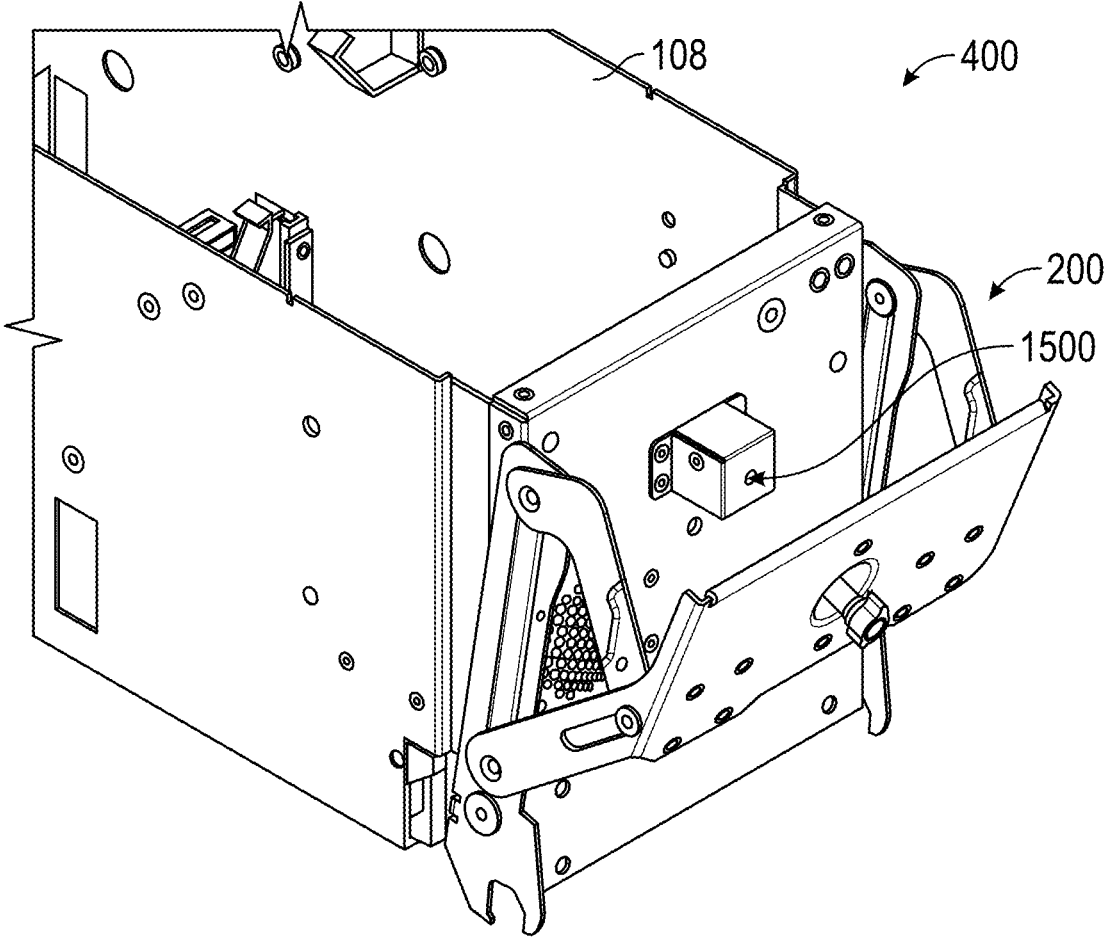
FIG. 15 shows a perspective view of a connecting rod module in a pre-opened state while connected to an object, according to aspects of the present disclosure.
Figure 16:
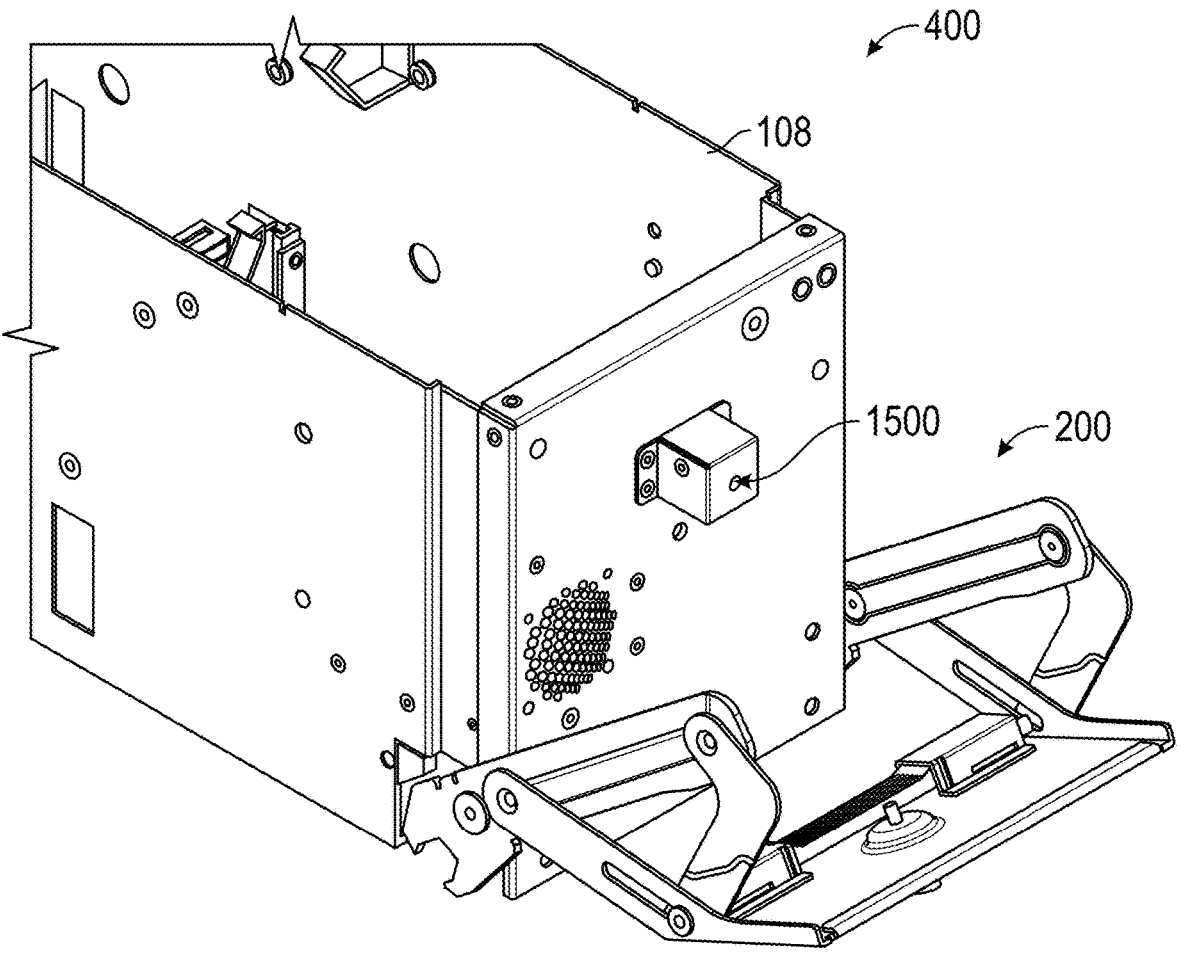
FIG. 16 shows a perspective view of a connecting rod module in an extended state, according to aspects of the present disclosure.

Operation of the connecting rod module 400 can be divided generally into three states: the closed state, as shown in FIG. 14; the pre-opened state, as shown in FIG. 15; and the extended state, as shown in FIG. 16. Details for transitioning from the closed state of FIG. 14 to the extended state of FIG. 16 are discussed in below.

Referring to FIG. 17, shown is the pump module 108 with the connecting rod module 400 connected thereto. The connecting rod module 400 includes the fastener 410, which couples the handle plate 212 of the handle assembly 200 to the pump module 108 via the aperture 1500, shown in FIG. 15, in the pump module 108. Thus, the fastener 410 on the handle plate 212 first is loosened and withdrawn in the direction of arrow 1700 in FIG. 17. However, as described above, in some implementations the connecting rod module 400 may lack fastener 410.

Referring to FIG. 18, after loosening the fastener 410, the lever 408 of the connecting rod module 400 can begin to rotate in the direction of arrow 1801 around hinge 1800, where the lever 408 connects to the pump module 108. In some implementations, the handle assembly 200 begins to rotate because of a force applied thereto, such as by a hand of a user or by a spring 1802 that is connected to the lever 408 and the pump module 108 at the hinge 1800.

Figure 19:
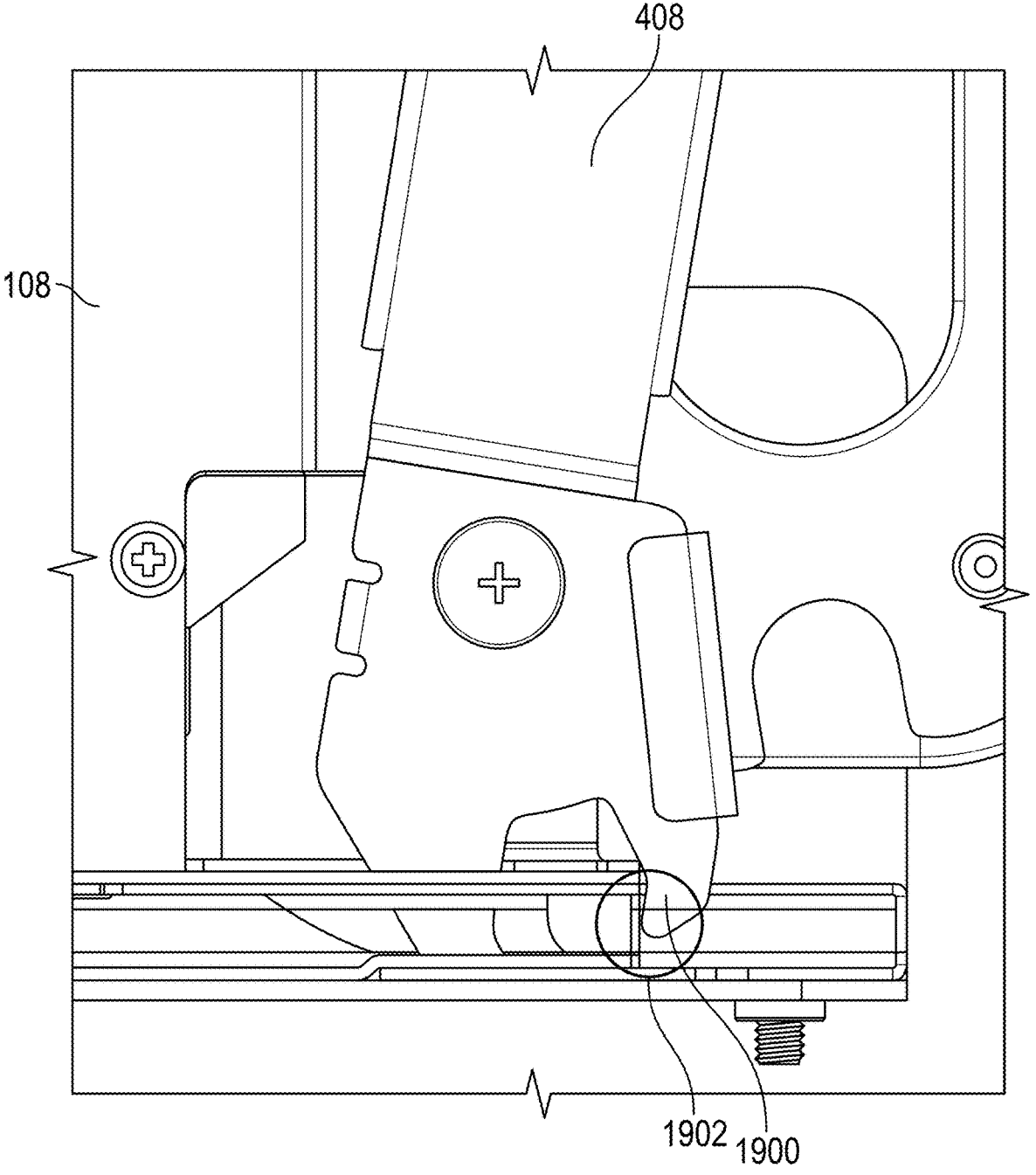
FIG. 19 shows a partial detailed side view of the connecting rod module in an initial open state, according to aspects of the present disclosure.

Referring to FIG. 19, the lever 408 stops rotating when a hook 1900 of the lever 408 touches a stop point 1902 of the enclosure 102. The stop point 1902 can be any feature of the enclosure 102 that is located around the connecting rod module 400 and the pump module 108. In implementations that include the spring 1802, the spring 1802 can cause the hook 1900 of the lever 408 to contact the stop point 1902. After the hook 1900 of the lever 408 reaches the stop point 1902 of the enclosure 102, the connecting rod module 400 is in an initial opened state.

Figures 20, 21:
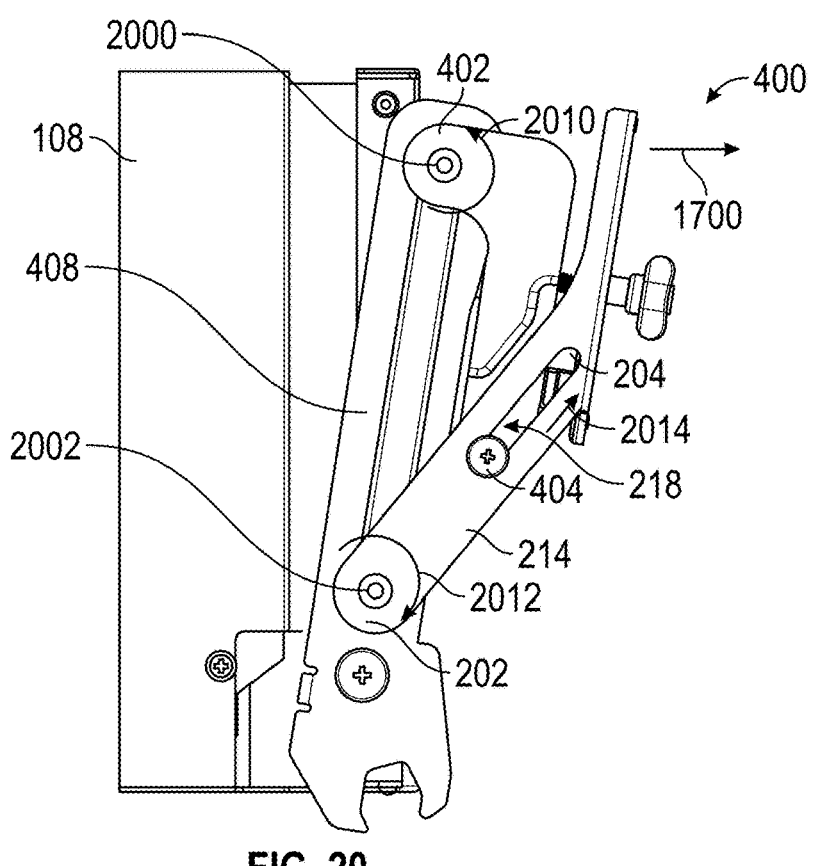
FIG. 20 shows a side view of the connecting rod module in an initial open state, according to aspects of the present disclosure.
FIG. 21 shows a side view of the connecting rod module in the pre-extended state, according to aspects of the present disclosure.

Referring to FIG. 20, the connecting rod module 400 is shown in the initial opened state. When further operating the connecting rod module 400, the handle plate 212 of the connecting rod module 400 can be pulled further in the direction of arrow 1700. At this point, the connecting rods 402 rotate counterclockwise in the direction of arrow 2010. Specifically, the connecting rods 402 rotate in the direction of arrow 2010 at hinge 2000 where the connecting rods 402 are connected to the levers 408. The handle arms 214 rotate clockwise in the direction of arrow 2012. Specifically, the handle arms 214 rotate in the direction of arrow 2012 at the hinge 2002 wherein the handle arms 214 are connected to the levers 408. The fasteners 404, which secure the handle arms 214 to the connecting rods 402, and the projection 412 slide in the slots 218 of the handle arms 214 in the direction of arrow 2014 until the fasteners 404 reach the opposite end of the slots 218. As the fasteners 404 reach the opposite end of the slots 218, the latch 204 can be depressed and released to let the projections 412 be retained by the sliders 206, as shown in FIGS. 9 and 10A-10C. The resulting configuration is the pre-opened state, as shown in FIG. 21, as well as FIG. 15.

Figure 22:
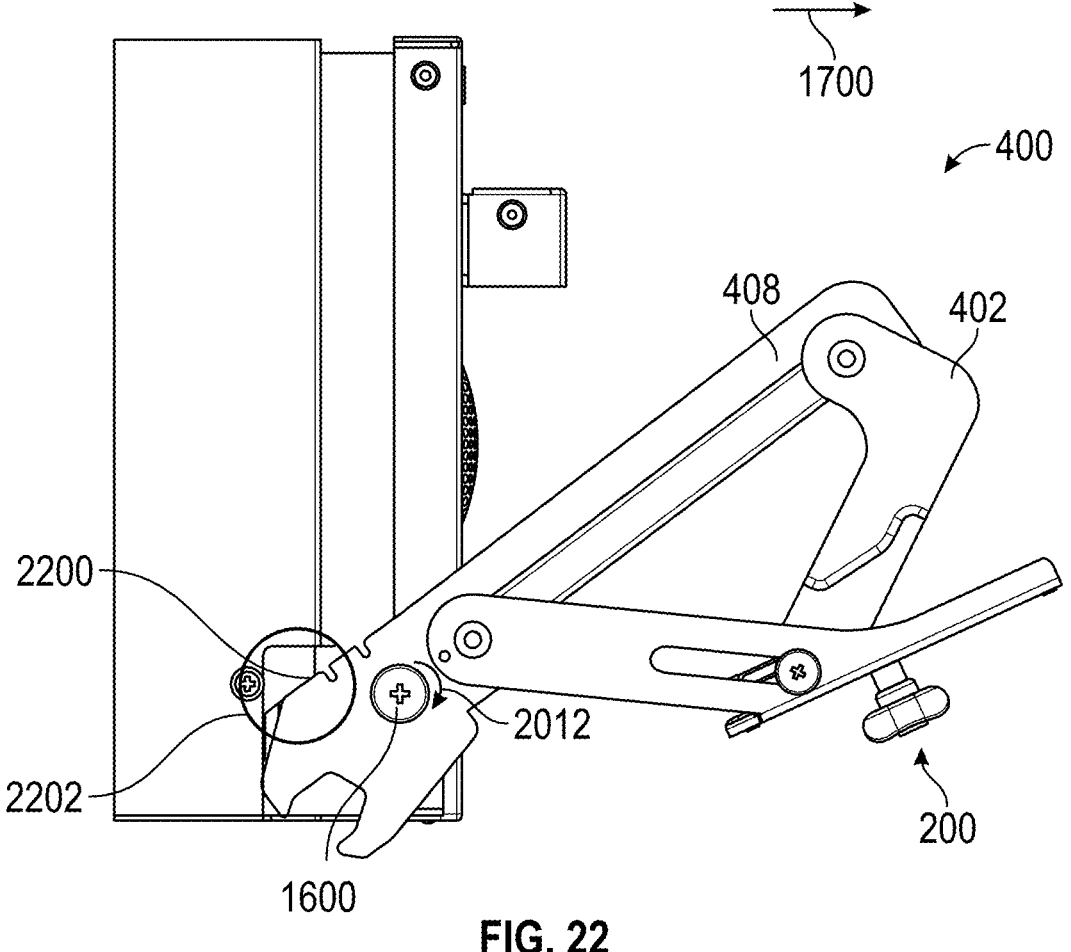
FIG. 22 shows a side view of the connecting rod module in the extended state, according to aspects of the present disclosure.

Referring still to FIG. 22, when further operating the connecting rod module 400, the handle plate 212 of the connecting rod module 400 can be pulled further in the direction of arrow 1700. This causes the entire connecting rod module 400 to rotate. Specifically, the lever 408 rotates at hinge 1600 relative to the pump module 108 in the direction of arrow 2012.

Upon the connecting rod module 400 further rotating, a contact surface 2200 of the lever 408 contacts a stop point 2202 on the pump module 108, which limits the connecting rod module 400 from further rotating. At which point, the connecting rod module 400 is in the extended state, as shown in FIG. 22, as well as FIG. 16. Thereafter, the pump module 108 can be pulled out of the respective enclosure. Moreover, the process described above with respect to FIGS. 14-22 can be carried out in reverse for inserting the pump module 108 into an enclosure.

The connecting rod module 400 of the present disclosure achieves the function of increasing the opening angle of the handle mechanism and the hand operating space. Table 1 below shows a numerical comparison of a conventional/original module and the connecting rod module of the present disclosure. For both examples, the conventional/original module and the connecting rod module were used in the arrangement shown in FIG. 1. In the pre-opened state, a gap in Table 1 the distance between the top of the conventional/original module and the connecting rod module and the bottom of the drain pan 104 shown in FIG. 1.

| | Original Module | Connecting rod Module |
|---|---|---|
| Closed State | | |
| Gap (mm) | 15.85 | 12.85 |
| Pre-opened State | | |
| Gap (mm) | 24.11 | 36.64 |
| Angle (°) | 9 | 21.4 |

The connecting rod module of the present disclosure solves the problem of insufficient operating space in the server rack. The connecting rod module also reduces the risk of hand pinching. The connecting rod module can increase the opening angle to ensure that users can smoothly operate a tray bracket in a limited space. At the same time, the slider mechanism can fix the opening angle and change the hand operating position to avoid pinching the hand when pushing the tray bracket. In addition, the application scope of this connecting rod module is not limited to server racks. The connecting rod module can be used in any application where an object must be inserted into and removed from a space.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A handle assembly comprising:
   a handle mechanism having a handle plate and handle arms extending from opposite sides of the handle plate;
   one or more springs coupled at first ends thereof to the handle plate;
   a latch extending at least partially across the handle plate, the latch abutting against second ends of the one or more springs such that the one or more springs urge the latch away from the handle plate, each end of the latch including a latch projection and two latch surfaces;
   a pair of sliders engaged with the latch at opposite ends thereof, each slider of the pair of sliders including two slider projections and a slider surface; and
   a pair of brackets attached to the handle plate for securing the pair of sliders to the opposite ends of the latch, each bracket of the pair of brackets including a first bracket slot through which one latch projection extends and a second bracket slot through which the two slider projections of a respective slider extend, the first bracket slot being oriented generally perpendicular to the second bracket slot, the first bracket slot and the second bracket slot being angularly oriented to the latch surfaces and the slider surface.

2. The handle assembly of claim 1, wherein, for each slider of the pair of sliders:
   one slider projection of the two slider projections contacts a first latch surface of the two latch surfaces, and
   the oblique slider surface contacts a second latch surface of the two latch surfaces.

3. The handle assembly of claim 1, wherein each end of the latch includes a pair of the latch projection on opposite sides of the latch, and each bracket of the pair of brackets includes a pair of the first bracket slot on opposite sides of the bracket.

4. The handle assembly of claim 1, wherein the two latch surfaces of each end of the latch are oriented in alignment with the slider surfaces of each of the respective sliders.

5. The handle assembly of claim 4, wherein the first bracket slot and the second bracket slot are angled 45 degrees relative to the latch surfaces and the slider surfaces.

6. The handle assembly of claim 1, wherein the latch plate includes a latch plate aperture that accepts a fastener.

7. The handle assembly of claim 1, wherein each of the handle arms includes a handle arm slot.

8. The handle assembly of claim 1, further comprising a nut slidably positioned within each one of the handle arm slots.

9. The handle assembly of claim 8, wherein:
   the pair of sliders restrict the nuts from sliding within the handle arm slots in a first state of the pair of sliders, the latch, and the nuts, and
   the pair of sliders do not restrict the nuts from sliding within the handle arm slots in a second state of the pair of sliders and the latch.

10. The handle assembly of claim 9, wherein the first state includes:
   the latch extended away from the handle plate by the one or more springs,
   the pair of sliders extended outward based, at least in part, on a first of the two latch surfaces and the slider surface, and
   the pair of sliders abutting the nuts with the nuts at first ends of the handle arm slots.

11. The handle assembly of claim 9, wherein the second state includes:
   the latch depressed toward the handle plate,
   the pair of sliders extended inward based, at least in part, on a second of the two latch surfaces and respective projections of the sliders, and
   the pair of sliders abutting the nuts with the nuts at first ends of the handle arm slots.

12. A connecting rod module for withdrawing and inserting an object within an enclosure, the connecting rod module comprising:
   a handle assembly including:
      a handle mechanism including a handle plate and handle arms extending from opposite sides of the handle plate, each of the handle arms including a handle arm aperture and a handle arm slot;
      a latch extending at least partially across the handle plate; and
      a pair of sliders engaged with the latch at opposite ends thereof;
   a pair of connecting rods, each connecting rod being secured at a first connecting rod end to a respective one of the handle arms by a nut extending through the connecting rod and into the handle arm slot of the respective one of the handle arms; and
   a pair of levers, each lever being secured at a first lever end to a respective one of the connecting rods at a second connecting rod end and secured at a respective one of the handle arms at the respective handle arm aperture,
   wherein the latch in a first state causes the pair of sliders to block the nuts of the connecting rods within the respective handle arm slots, and the latch in a second state causes of the pair of sliders to not block the nuts of the connecting rods within the respective handle arm slots.

13. The connecting rod module of claim 12, wherein each lever is rotatably connected to the respective one of the connecting rods at the first lever end.

14. The connecting rod module of claim 12, wherein each lever is rotatably connected to a respective one of the handle arms at the handle arm aperture of the respective handle arms.

15. The connecting rod module of claim 12, wherein each connecting rod is rotatably secured at the first connecting rod end to the respective one of the handle arms by the nut.

16. The connecting rod module of claim 12, wherein the latch includes oblique latch surfaces at opposite ends thereof, and each slider includes an oblique slider surface that interfaces with one of the oblique latch surfaces to cause the slider to retract into the latch when the latch is depressed toward the handle plate such that the slider does not restrict movement of the nut.

17. The connecting rod module of claim 12, wherein each lever includes a hook at a second lever end, opposite the first lever end, and the hook is configured to contact a first stop point of the enclosure.

18. The connecting rod module of claim 17, wherein each lever includes a lever contact surface at the second lever end, and the lever contact surface is configured to contact a second stop point of the object.

19. A method for allowing withdrawal of an object from an enclosure, the method comprising:
   providing for a lever rotatably connected to the object to rotate away from the object at a first hinge until a hook on the lever contacts a first stop point on the enclosure;

providing for a handle arm connected to the lever to rotate away from the object at a second hinge;

providing for a connecting rod connected to the handle arm to rotate away from the object at a third hinge, rotation of the handle arm and the connecting rod causing a nut connecting the handle arm to the connecting rod to move from a first end of a handle arm slot within the handle arm toward a second end of the handle arm slot;

providing for a latch secured on a handle plate connected to the handle arm to transition between a first state, that retracts a slider relative to the latch, and a second state, that extends the slider relative to the latch, so that the slider allows the nut to access the second end of the handle arm slot and restricts the nut from leaving the second end of the handle arm slot; and providing for the lever rotatably connected to the object to rotate further away from the object at the first hinge until a lever contact surface of the lever contacts a second stop point on the object.

20. The method of claim 19, further comprising providing for a fastener that extends through an aperture of the handle plate to release from the object to permit the handle plate to be rotated away from the object.

\*   \*   \*   \*   \*